United States Patent [19]

Brown et al.

[11] Patent Number: 4,658,400
[45] Date of Patent: Apr. 14, 1987

[54] WSI TESTER

[75] Inventors: Harold E. Brown, Santa Clara; Steven I. Mozsgai, Cupertino; Jason C. Chen, Santa Clara, all of Calif.

[73] Assignee: Trilogy Computer Development Partners, Ltd., Cupertino, Calif.

[21] Appl. No.: 618,095

[22] Filed: Jun. 7, 1984

[51] Int. Cl.[4] .............................................. G06F 11/00
[52] U.S. Cl. ........................................ 371/25; 371/20
[58] Field of Search ............................ 371/25, 24, 20; 324/73 R; 364/200 MS File, 900 MS File

[56] References Cited

U.S. PATENT DOCUMENTS

| | | | |
|---|---|---|---|
| 4,497,056 | 1/1985 | Sugamori | 371/25 |
| 4,498,172 | 2/1985 | Blavsar | 371/25 |
| 4,503,537 | 3/1985 | McAnney | 371/25 |
| 4,513,418 | 4/1985 | Bardell | 371/25 |
| 4,517,672 | 5/1985 | Pfleiderer | 371/25 |
| 4,523,312 | 6/1985 | Takeuchi | 371/25 |
| 4,534,028 | 8/1985 | Trischler | 371/25 |
| 4,546,473 | 10/1985 | Eichelberger | 371/25 |

Primary Examiner—Michael R. Fleming
Attorney, Agent, or Firm—Townsend and Townsend

[57] ABSTRACT

A test system including a data center, controller, interface, and device under test. The data center generates a test program which is applied to the device under test by the controller via the interface. The device under test includes circuitry structured for testing. The test system identifies the location of faulty elements on the device under test and stores these locations for use in a subsequent repair step.

5 Claims, 6 Drawing Figures

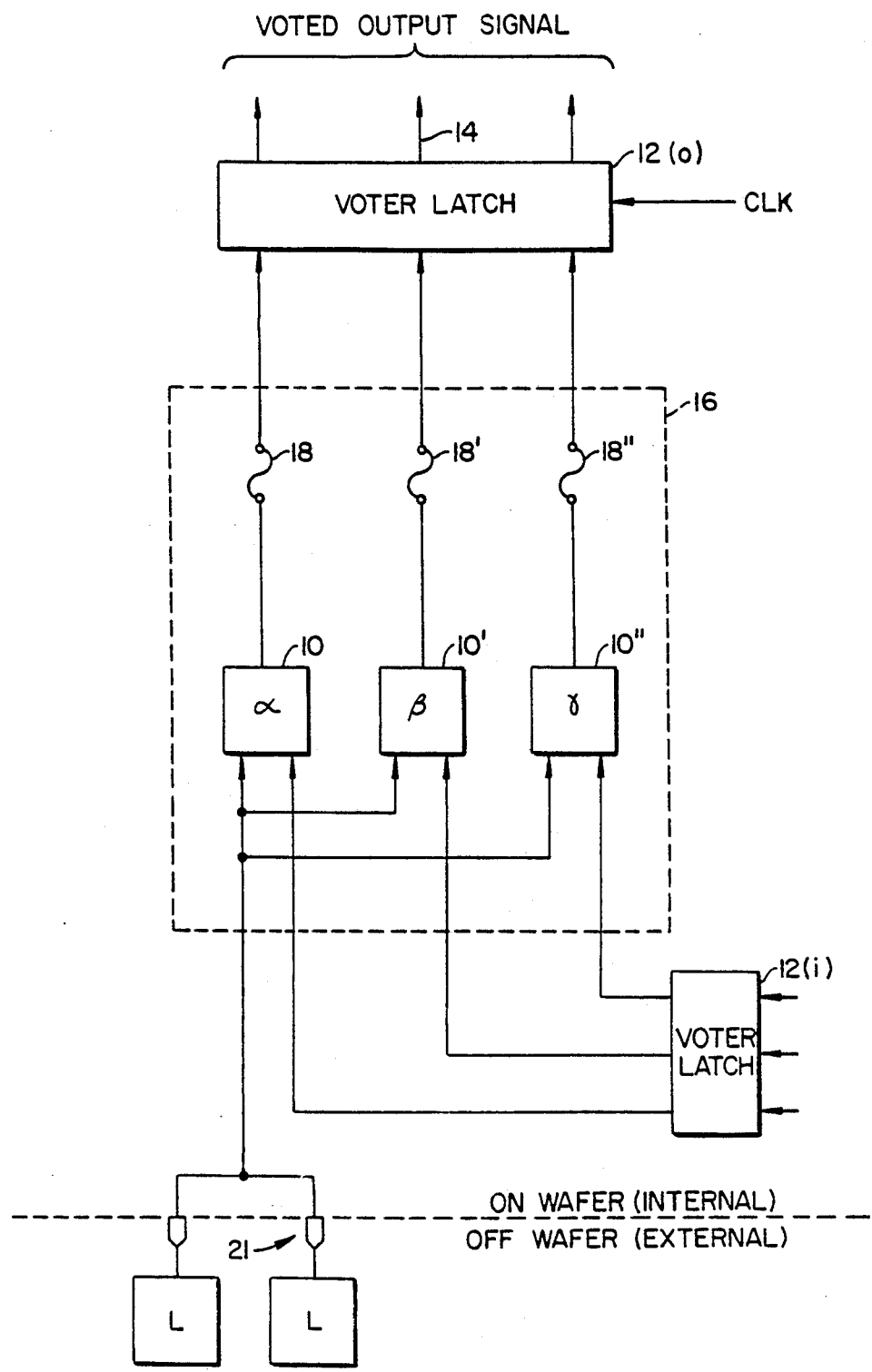
FIG._1.

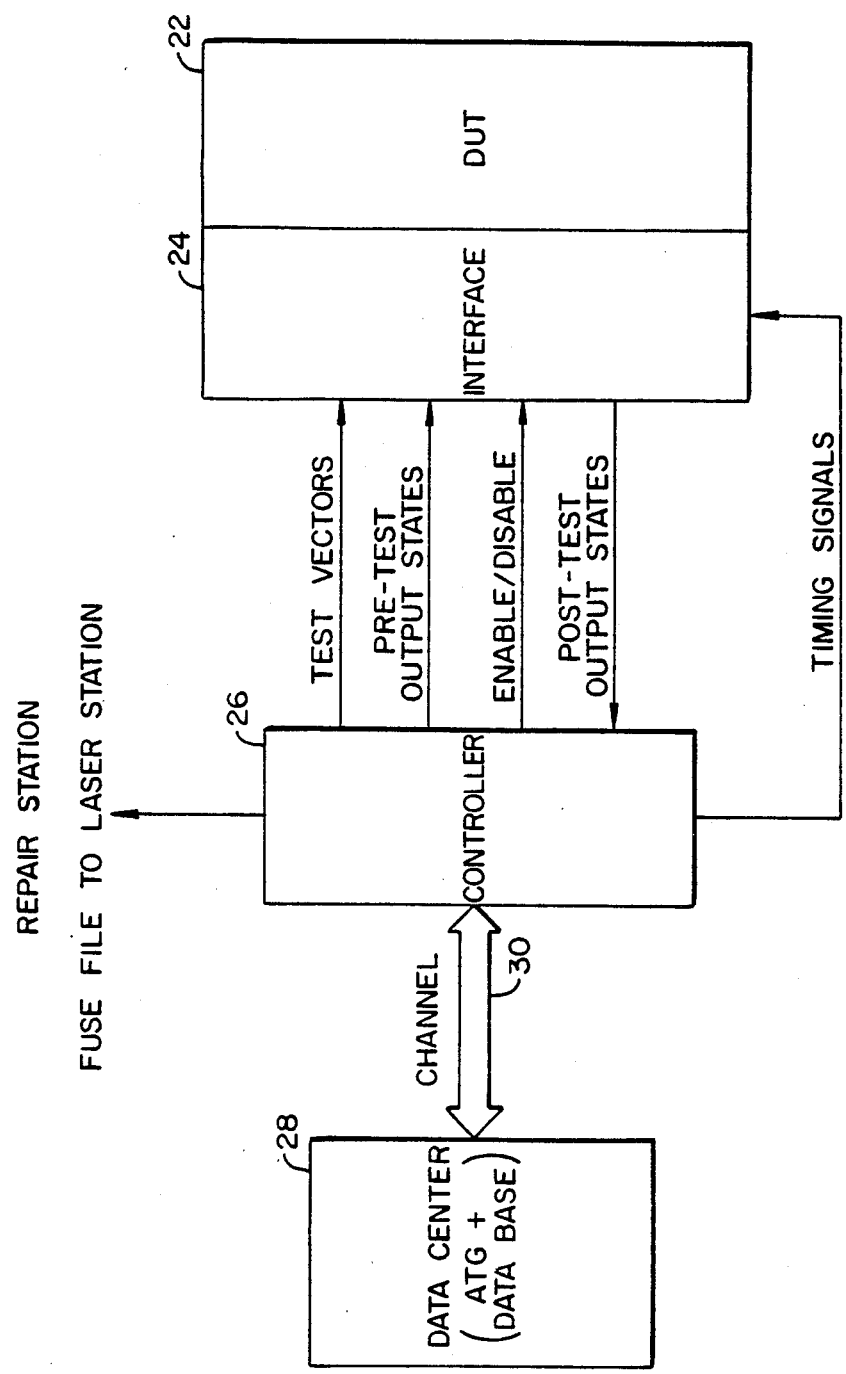
FIG._2.

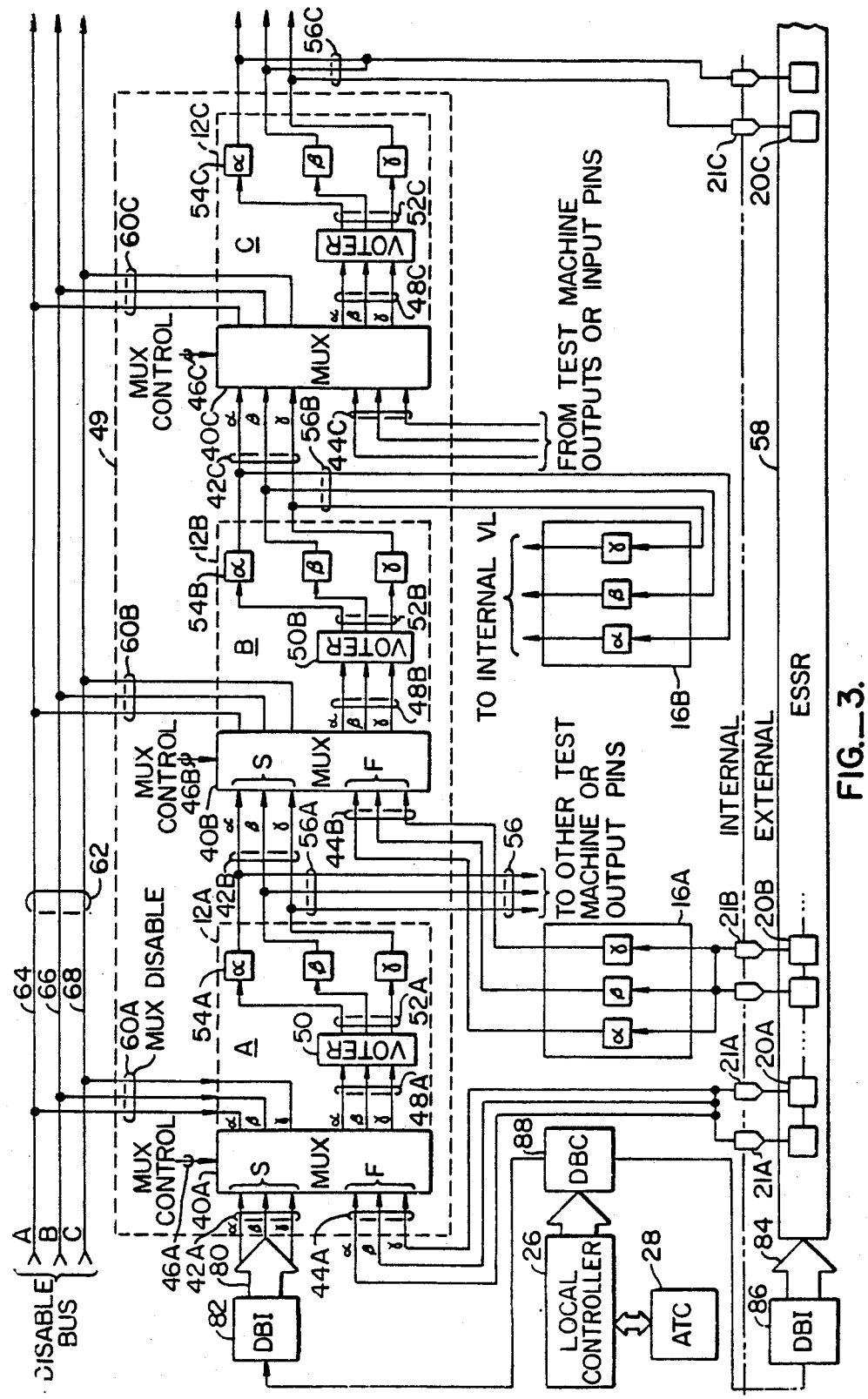
FIG._3.

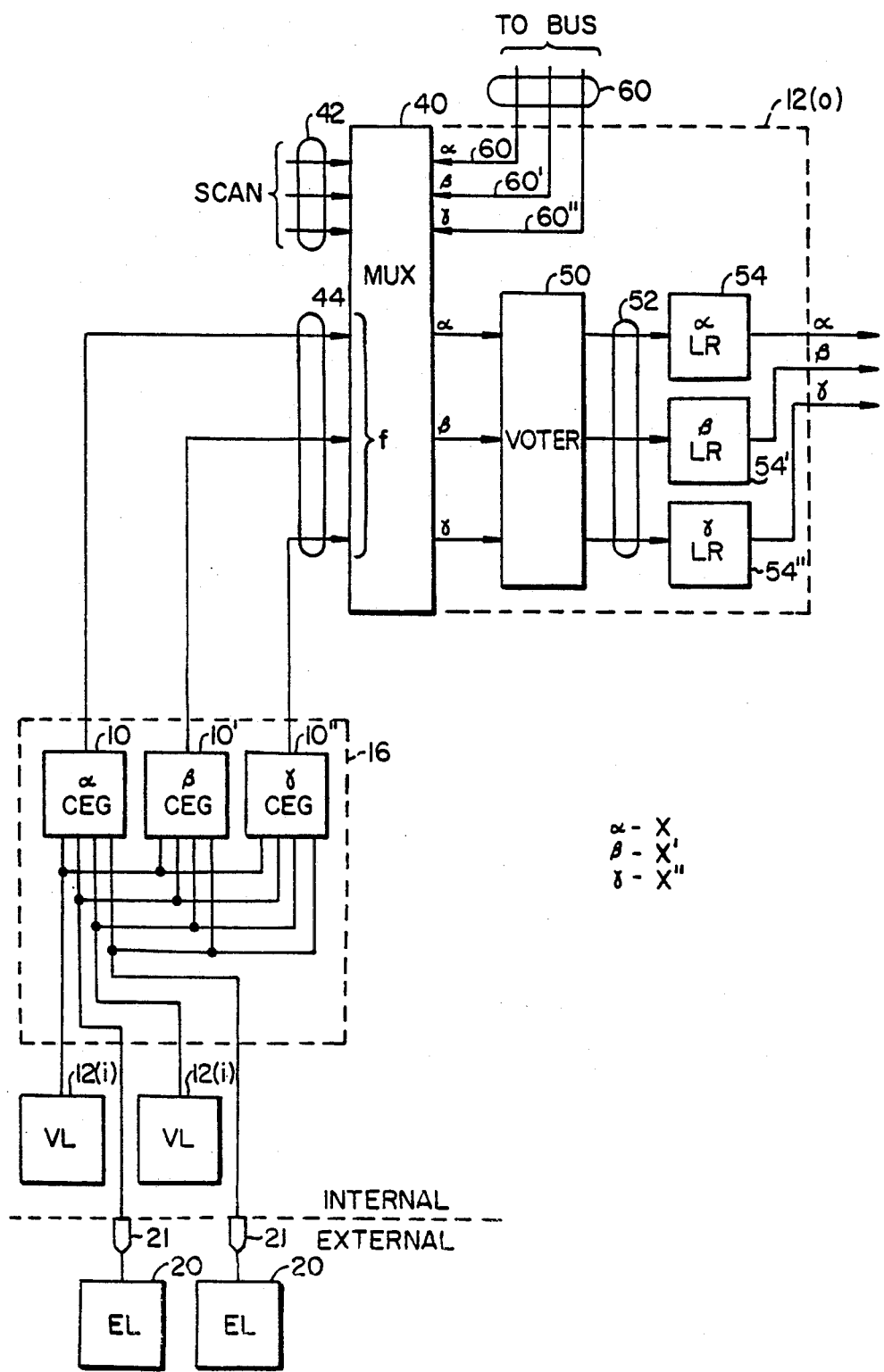
FIG._4.

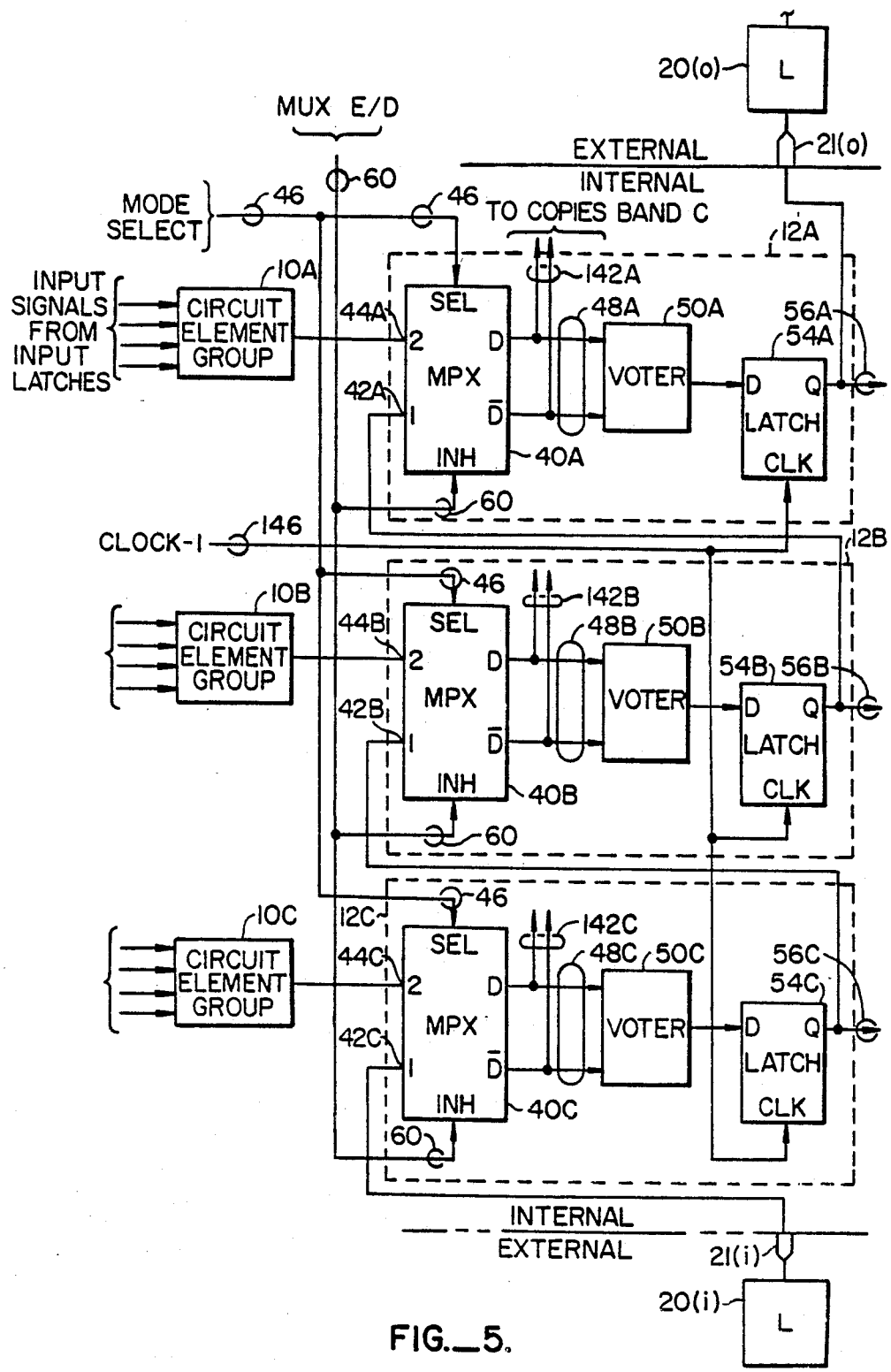
FIG._5.

WSI TESTER

BACKGROUND OF THE INVENTION

1. Field of the Invention

The present invention relates generally to a tester for an integrated circuit and, more particularly, to a tester for a repairable integrated circuit including multiple copies of a given microcircuit.

2. Description of the Prior Art

The microelectroelectronics industry is extremely competitive. Although the general economy has been highly inflationary, price reduction has been the norm in the microelectronics industry. To succeed in the marketplace, a new product must be technologically innovative and inexpensive.

One limitation of semiconductor fabrication processes is the introduction of defects into the circuits fabricated. The active region of a semiconductor device includes the area on the surface of the device in which microcircuit elements have been fabricated. For most fabrication processes, the density of circuit elements is roughly constant and the probability of a defect being introduced into the active region of the device is proportional to the area of the active region.

Each device produced must be tested to determine whether defects in the microelectronic circuit elements fabricated in the device will adversely affect the performance of the device. A device that does not function correctly is termed a bad device. The cost of producing and testing a bad device is equal to the cost of producing and testing a good device. Therefore, the cost of a good device is determined, in part, by the percentage of the total number of devices fabricated that are good, i.e., the yield of the fabrication process. To increase yield and reduce cost, the area of the active region of the device should be small, because the probability of a device being bad increases as the area of the active region increases. However, increasing the performance of a device generally requires that the area of the active region be increased to incorporate additional circuitry.

Accordingly, the goals of increasing performance and decreasing cost impose conflicting criteria for determining the size of the active region of the device. Designers of semiconductor devices require means for increasing the amount of circuitry on a device without decreasing the yield of the device.

SUMMARY OF THE INVENTION

The present invention provides a system for testing a repairable high yield integrated circuit device with an active region extending over the surface of a semiconductor wafer. The technology for forming this integrated circuit is denoted wafer scale integration (WSI) technology. The test system is required to achieve the above-described WSI because the reparability of the device is dependent on the ability of the test system to identify defective components in the device. These identified components are removed from the circuit to repair the device. This repairability increases the yield of the fabrication process, thereby decreasing the cost of the device.

The external tester is the apparatus that connects to the device to perform the test. However, the circuitry of the device is structured for testing and some elements of the test system are included in the circuitry on the device.

The device under test (DUT) has a plurality of copies of a given microelectronic circuit formed in the active region of the DUT. In a preferred embodiment of the testing system, the device includes three copies of the microelectronic circuit designated the A, B and C copies. Each copy includes combinational logic networks and sequential elements therein. The multiple copies of the circuit are connected to give the device a self-repairing capability. Additionally, the tester of the present invention is capable of locating defective sections of a circuit copy and providing the location of a fuse for removing the defective section from the circuit copy. The device then utilizes a non-defective replica of the removed section in another copy to function correctly. This technology is being utilized to form ICs with active areas covering substantially the entire surface of a semi-conductor wafer approximately five inches in diameter. As is well-known in the art, standard ICs are formed on semiconductor chips approximately a quarter inch square. Thus, the present technology represent a great step forward in IC arts.

The circuitry in a given copy is divided into circuit element groups (CEG). A CEG is defined as a circuit consisting only of combinational logic with the CEG inputs being either the output of an internal latch or an input port of the device and with the CEG output being directed to the input of an internal output voter latch. Each copy of the microelectronic circuit is divided identically so that three replicas of each CEG are included on the device. The output signals from each replica are routed to a voter latch, which allows the output signals from the replicas to participate in a voting process. The set of CEG replicas is designated a test machine. The outputs of each test machine is routed to the voter latch. The device includes circuitry, e.g., an enable/disable bus, for enabling any given CEG in a test machine to participate in the voting process and for disabling the remaining CEGs from participating in the voting process.

In this voting process, a voting circuit in the voter latch produces three output signals where the state of each output signal is equal to the state of the majority of the output signals from the CEG replicas. This voting process provides a self-repairing capability to the device. For example, in a given test machine, if a single CEG replica were bad, i.e., the CEG replica includes a defect which causes the state of the output signal from that replica to be different than the output signal from a CEG replica without a defect, and the other two CEG replicas were good, then the state of the majority of the CEG replica outputs would be correct and the state of the output signals from the voting circuit would be correct. Thus the combination of redundant CEG replicas with outputs connected to a voting circuit increases the yield of the device by negating the effect of certain defects produced in the fabrication process. However, if two CEG replicas in a test machine were bad, then the state of the output signals from the voting circuit would be incorrect. The present invention provides a test system for identifying which CEG replicas are bad machines to facilitate the repair of the device.

When in operation, the device is in a functional mode where the CEGs and sequential networks in each copy of the microelectronic circuit function to receive input signals at the I/O ports of the device, process these signals according to the function of the device, and provide output signals at the I/O ports of the device.

When being tested, the device is in a testing mode where the device is configured so that the input state of each test machine may be set and the output state of each test machine may be observed by the test system. In one embodiment, the internal voter latches corresponding to a first set of test machines are interconnected to form an internal scan shift register (ISSR). The ISSR is utilized to load and unload the internal voter latches prior to and subsequent to testing. The ISSR is connected to the DBI (diagnostic bus interface) which control the internal scan. The external scan is independently controlled by the DBI and each latch on the ESSR is connected to one of the wafer I/O pins. ISSR and ESSR can work independently.

The testing system includes an external tester, i.e., the components of the system external to the DUT, comprising a data center, a local controller, and an interface. The data center includes an automatic test generation (ATG) system which generates a test program for testing the test machines in the DUT. This test program is transferred to the local controller, which applies the data in the test program to the I/O ports of the DUT using the ESSR and receives the output signals from the DUT generated in response to the test program via the interface.

This interface is a physical motherboard including a gate array mounted thereon forming an external scan shift register (ESSR). The latches of the ESSR are interconnected to the I/O ports of the DUT. Thus, the ESSR may be utilized to apply selected logic states to the input ports of the DUT and to receive output states from the output ports of the DUT. The ESSR and ISSR are controlled by a diagnostic bus controller (DBC) via a diagnostic bus interface (DBI).

According to one aspect of the invention, the internal scan shift register (ISSR) includes three shift register copies. Each shift register copy links a set of latch replicas together where each internal voter latch includes three latch replicas corresponding to the three shift register copies. The internal voter latch includes voting circuitry to allow the outputs from the latch replicas to participate in a voting process. As described above for the test machines, the voting circuit provides a self-repairing capability to the ISSR.

During testing, an ISSR test bit string and an ISSR expected value bit string, generated by the ATG, are transferred from the data center to the controller. The ISSR test bit string is loaded into the ISSR and shifted in. A single clock is issued and the logic will generate an ISSR post-test output bit string. This post-test output bit string is then compared with the expected value bit string. If the two bit strings don't match, then they are transferred to the data center for determination of which ISSR latches are bad.

The bad output latch replicas in a bad voter latch are identified by enabling a given shift register copy, disabling the remaining shift register copies, and testing the enabled copy as described above to determine whether the latch replica in the enabled copy is bad. The remaining copies are then sequentially enabled and tested. The locations of the bad latch replicas are stored in the controller for utilization in a subsequent repair step.

According to a further aspect of the invention, the test program includes a set of test vectors for application to the inputs of the test machines in the first set, a set of pre-test output states, for setting the state values in the internal output voter latches prior to testing, and a set of post-test expected values, reflecting the output state of a good test machine in response to a corresponding test vector. The test program is transferred from the data center to the controller via a communication channel (standard IBM type). The controller then loads the test vectors into the ESSR and ISSR and shifts the vectors until each vector is positioned in the latches connected to the inputs of the vector's corresponding test machine. Similarly, the controller loads a pre-test output bit string (PROSBS) into the ESSR and ISSR and shifts the PROSBS until the pre-test output state corresponding to each test vector is loaded into the internal output voter latch interconnected with the output of the test machine having the corresponding test vector at its inputs. The controller then clocks the test machine through one machine cycle and loads the output state of each test machine generated in response to the corresponding test vector into the corresponding internal output voter latch. These post-test states comprise the post-test output bit string (POSBS), which is then shifted through the ESSR and ISSR into the controller, and each posttest output state in the POSBS is compared with the post-test expected value generated by the test program. If the values of the output states in the POSBS do not match with the expected values generated by the test program, then the POSBS is transferred to the data center, where the locations of bad test machines are determined.

As described above, a bad test machine will include wither two or three bad CEGs. If only two CEGs are bad, then they may be disconnected from the circuit on the device and the test machine output will correspond to the output of the remaining good CEG, thereby repairing the test machine to provide a functional device. However, if all three CEGs are bad, then the device is not repairable and must be discarded.

The following procedure is utilized to identify the bad CEGs in a bad test machine. First, the ISSR is loaded and then the enable/disable bus is utilized to enable only the CEGs in the A Copy of the microelectronic circuit to participate in the voting process, while the CEGs in the B and C copies of the microelectronic circuit are disabled from participating in the voting process. The DUT is clocked once, with only the A circuit CEGs enabled, to determine whether the A CEG replica in the bad test machine is a bad CEG. Depending on whether the CEG replica in the A circuit is bad or good, the remaining CEGs replicas in the bad test machine may be sequentially enables and tested. The identity of the bad CEGs is stored in a fuse file in the controller.

The fuse file may be utilized in a subsequent repair step in which the bad CEGs are disconnected from the circuitry on the device by either static or dynamic means. An example of a static disconnection scheme would be blowable fuses for disconnecting the bad CEGs. Alternatively, dynamic means include a latch, which may be set to isolate the bad CEG with a gating network.

The redundancy circuitry described above greatly increases the yield for a device having a large active area. However, the ability to detect defective CEG replicas provided by the test system of the present invention substantially further increases the yield to a point where such devices are economically variable.

BRIEF DESCRIPTION OF THE DRAWINGS

FIG. 1 is a schematic diagram of a test machine utilized in the microelectronic circuit of the device under test.

FIG. 2 is a block diagram of a preferred embodiment.

FIG. 3 is a schematic diagram of the device under test connected with components of an external tester.

FIG. 4 is a schematic diagram of a test machine and interconnected internal output voter latch.

FIG. 5 is a schematic diagram of the internal scan shift register.

FIG. 6 is a schematic diagram showing the redundant structure of a voter latch.

DETAILED DESCRIPTION OF A PREFERRED EMBODIMENT

The present invention provides an apparatus and a method for testing a semiconductor device including a plurality of copies of a microelectronic circuit formed on a semiconductor wafer. An example of such a semiconductor device is disclosed in a copending commonly-assigned U.S. patent application, Ser. No. 595,097, which is hereby incorporated by reference. The disclosure of that application will be briefly recapitulated with reference to FIG. 1. In the discussion that follows all references will be made to a device having three copies of a given microelectronic circuit. It is to be clearly understood, however, that the invention described below is not limited to any particular number of copies.

Each microcircuit copy on the device is divided into sections in a manner to be more fully described below, where each section is designated a circuit element group (CEG). Each copy is divided into identical circuit element groups. FIG. 1 depicts three such circuit element groups, labeled alpha, beta, and gamma, 10. 10' and 10". In the following discussion the three copies of the microelectronic circuit are designated Copy A, Copy B, and Copy C. All reference numerals to elements of Copy A will be unprimed. The reference numeral designating the identical element in Copy B will be identified by the same reference numeral primed, while the identical elements in Copy C will be identified by the same reference numeral double-primed. Thus, in FIG. 1, CEGs alpha, beta, and gamma, 10, 10', and 10", are identically configured. The outputs from the CEGs 10, 10' and 10" are routed to a voter latch 12 which allows the CEGs 10, 10', and 10" to participate in the voting process described below. It will be assumed hereinafter that all signals are digital signals and may be either in a high state or a low state. The voter latch 12 accepts the signals from the CEGs 10, 10', and 10" and provides a voted output signal on the output line 14, 14', and 14".

In the voting process the state of the voted output signal is set equal to the state of the majority of the output signals from the CEGs 10, 10', and 10". A complete description of the voting circuitry including circuit diagrams is presented in the above-referenced patent application. The combination of the identical CEGs 10, 10' and 10" is designated a test machine 16. The configuration of a CEG in a given copy of the microelectronic circuit is determined as follows: First, one locates an output voter latch in the given copy of the microelectronic circuit. Second, one fans back through every subcircuit feeding this voter latch until either another voter latch, a latch other than a voter latch, or an input pin to the device is encountered. The CEG includes all subcircuits encountered.

This procedure is illustrated by FIG. 1. Starting at the output voter latch 12(o), one fans back through the circuitry of the A copy [represented by box alpha 10] until another voter latch 12i or an input port (represented by a parallel circuit including two I/O pins) 21 is encountered. The circuitry included in box alpha 10 is purely combinatorial, i.e., contains no latches. The state on the input port 21 is set by the outputs of external latches. The wafer includes appropriate circuitry to fan the output of internal voter latch 12(i) to all three CEG replicas 10, 10' and 10" in the test machine 16.

The advantages of a semiconductor device incorporating the redundant circuitry and interconnected voting circuitry described with reference to FIG. 1 is set forth in detail in the above-referenced application. Briefly, this configuration compensates for the presence of defective circuitry in a semiconductor device. For example, if the gamma CEG 10" in FIG. 1 were bad, but the alpha and beta CEGs, 10 and 10', were good, then the output state of CEGs alpha and beta would be correct while the output state of the gamma CEG 10" would be incorrect. The majority of input states to the voter latch 12 are correct, therefore, all the outputs states on lines 14, 14', and 14" are correct. The incorrect output from the defective gamma CEG is outvoted by the correct output signals from the alpha and beta machines. Accordingly, a test machine 16 with two good CEGs 10 included therein will provide an output signal having the correct state. Thus, the existence of a defect that causes a CEG in a test machine does not necessarily mean that the test machine is bad. The defects must be configured so that at least two CEGs 10 in a given test machine 16 must be bad in order to render the entire test machine bad.

To further enhance the yield and cost-effectiveness of the device described in the above-referenced patent application, a repair capability has been designed into the device. The microelectronic circuit includes a fusible link 18 for disconnecting a defective CEG from the microelectronic circuit copy. This capability of disconnecting a given CEG provides a test machine repair capability. For example, assume that CEGs alpha, and beta, 10 and 10', in test machine 16 were defective and provided output signals having an incorrect state. The output signals from the voter latch 12 would then also have the incorrect state since a majority of the input signals were in the incorrect state. However, if the bad CEGs could be identified, then the fusible links 18' and 18" connecting the alpha and beta machines 10 and 10' to the voter latch 12 could be blown. The state of the output signals on the voter latch output lines 14, 14', and 14" would then be equal to the state of the good gamma machine 10" and the test machine 16 would be good.

A bad CEG is defined as a machine having a fault. One method for modeling faults in a combinational network is to assume that a gate in the combinational network has an input or an output that is stuck-at one or zero. For example, if an AND gate has inputs A and B and output C then input A would be stuckat one if input A always indicated one, regardless if the signal received at A were high (1) or low (0). Testing a combinational network reduces to the task of determining whether any of the gates in the network have stuck at faults. One procedure for testing a network is sequentially applying a set of test vectors to the inputs of a combinational network, where a test vector is a set of input states corresponding to respective inputs of the network. The response of the network to the test vector (the post-test output state) is compared to a expected value of the output state of a network with no faults. If the post-test output states do not have the same values as the expected values then the network is bad.

As the complexity of combinational logic networks increases, the generation of test vectors and expected output states becomes a difficult mathematical problem. However, the use of digital computers and the sophisticated mathematical methods described, for example, in the above-referenced article by Williams, et al., allow test generation for relatively deep combinational logical networks. Note that these test procedures described above are limited to combinational networks and do not apply to sequential networks. One approach to testing large VLSI integrated circuits is to interconnect latches within the circuits to form an internal scan shift register (ISSR). The ISSR is utilized when testing the device under test (DUT) to load the internal voter latches with states corresponding to the respective test vectors and pre-test output states of the test machines 16. A single clock then issues and the post-test output states are unloaded via the ISSR. The inputs and outputs of the device are received by external latches 20 connected to the I/O ports 21 of DUT. These external latches are interconnected to form an external scan shift register (ESSR), which is utilized to load the DUT prior to testing and to unload the DUT after testing.

FIG. 2 is a block diagram depicting the major components of the present invention. The device under test (DUT) 22 is a semiconductor device including the redundant circuitry and associated voting circuitry described above with reference to FIG. 1. The DUT 22 includes input/output ports which may be in the form of metal bumps disposed over the active region of the device.

The interface 24 is the physical board and associated circuitry for transferring signals between the DUT 22 and test controller 26. The interface 24 includes mechanical means making electrical contact with I/O ports of the device. If the wafer is mounted on a module then the interface 24 includes a zero insertion force (ZIF) connector. An unmounted wafer may be tested utilizing mechanical interconnect. The interface 24 includes a gate array forming the ESSR and a diagnostic bus interface (DBI) for providing signals to the ISSR and ESSR.

The controller 26 includes a digital computer and peripheral control boards, such as a diagnostic bus controller (DBC), for conducting the test program. The controller 26 is connected to the automatic test generation (ATG) data center 28, which is typically a mainframe computer, by a communication channel 30. The ATG data center 28 has a data base including the test vectors, pre-test output states, and expected output states required to test the DUT 22. These data are transferred to the controller via the communication channel 30.

It is to be understood that the WSI tester of the present invention includes all of the functional elements depicted in FIG. 2 including the DUT 22. The digital circuitry on the DUT 22 is highly structured to facilitate testing of the circuitry. In particular, the circuitry is designed so that the state values in all of the latches can be controlled to any specific value and can be observed in a straightforward manner during test generation. In order to facilitate the following discussion all the functional units depicted in FIG. 2 except the device under test are designated the external tester. The external tester must be compatible with the DUT 22 to test the CEGs in the DUT 22 for faults and to identify bad CEGs. However, the data center is computer programmable and generates tests for DUTs with varying microelectronic circuits formed thereon. Of course, each microelectronic circuit must be highly structured to facilitate testing and must be generally compatible with the capabilities of the external tester.

FIG. 3 is a schematic diagram depicting the structured design for testability of the DUT 22 and also depicting some of the functional elements of the external tester. It is emphasized that FIG. 3 is highly stylized diagram intended only to illustrate the function of test circuitry. Turning now to FIG. 3, the ISSR is depicted with three voter latches shown for purpose of illustration. The structure of the voter latch is shown in greater detail than in FIG. 1. Each voter latch 12 includes a multiplexer (MUX) 40 for receiving two sets of inputs termed scan and function 42 and 44. A MUX control signal 46 determines which set of inputs is gated to the MUX output lines 48. During testing (test mode) the scan inputs are gated to the MUX output lines to form the ISSR 49 while during operation (functional mode) the function inputs 44 are gated to the MUX output lines 48.

The MUX outputs are received by a voter circuit 50 which produces an output signal having the same state as the majority of the MUX output signals. This voted output signal is placed on the voter circuit output lines 52.

Thus, the voter circuit 50 allows the MUX output signals to participate in a voting process. If one of these MUX output signals is incorrect it will be "out voted" by the correct output signals. However, if two output signals are incorrect they will "out vote" the correct signal. The present tester identifies which of the MUX signals is correct and provides a means for eliminating the incorrect signals.

The voter circuit output signal is routed to a set of three latch replicas 54, designated alpha, beta, and gamma, controlled by an external clock. These latch replicas 54 provide a redundant self-correcting and repair capability to the ISSR 49 analogous to that of the test machines.

In effect, the ISSR 49 includes three shift register copies, corresponding to the A, B, and C copies of the microelectronic circuit, formed by interconnecting the alpha, beta, and gamma output latches 54 respectively. The interconnection of the latch replicas 54 and voting circuit of a given internal voter latch is analogous to the interconnection of the CEG replicas in the test machine 16 and the voter latch 12. The ISSR 49 compensates for the presence of a bad latch replica 54 in an internal voter latch 12 by allowing the good latch replicas to outvote the bad latch replica to provide an output signal from the voter circuit having the correct state. The ISSR 49 also includes fusible links for disconnecting bad output latches, thereby providing an ISSR repair capability. The control circuitry necessary to control the shifting of data between the various test machine storage elements is described below with reference to FIG. 5. Note that the internal voter latches in the ISSR 49 also have parallel outputs 56.

As described above, the ESSR 58 is realized as a gate array on the interface board 24. Each external latch 20 on the ESSR 58 is programmable to function as an external input latch or an external output latch. These external latches 20 are connected in parallel to the I/O pins 21 of the DUT.

Several examples for possible sources of the signals for functional inputs of the internal voter latches 12 are illustrated in FIG. 3. The first voter latch 12A has its functional inputs 44A connected to input pins 21A. The states on these pins 21A are controlled by external output latches 20A in the ESSR 58. Thus, the state in any selected voter latch in the ISSR 49 can be set by loading a predetermined state into external latch 20A via the ESSR 58, inputting the state through the functional inputs of the first internal voter latch 12A, and shifting the state via the scan inputs 42 to the desired internal voter latch 12.

A second internal voter latch 12B has its functional inputs 44B connected to a first test machine 16A. The inputs signals to test machine 16A are provided by external input latches 20B of the ESSR 58 via input ports 21B. Thus, the test inputs to the first test machine 16B may be set by the ESSR 58 and the output generated in response to test inputs stored in the second internal voter latch 12B. The output signals from the second voter latch 12B are directed to the inputs of a second test machine 16B by the parallel output lines.

A third internal voter latch 12C has its outputs connected to output ports 21C which are connected in parallel to external output latches 20C. Thus, the state in any voter latch may be unloaded by shifting the state via the scan inputs to the third internal voter latch 20C, loading the states into the external output latch 20 and shifting the state to the controller via the ESSR 58.

Each MUX includes three disable inputs 60 for disabling the signals from a selected copy of either the microcircuit or the ISSR 49 from participating in the voting process. The enable inputs are designated alpha, beta, and gamma and disable the alpha, beta, and gamma functional and scan inputs 42 and 44 respectively. A disable bus 62 includes A, B, and C, 64, 66 and 68, disable lines where the A line 64 activates all the alpha disable inputs 60 of the internal voter latches of the ISSR. The B and C 66 and 68 lines are similarly connected to the beta and gamma disable inputs 60.

This enable/disable bus 62 is utilized to enable only one given CEG 10 in a test machine 16 to participate in the voting process, while all other CEGs in the test machine are disabled from participating. Thus, the output of a voter circuit is changed from being the voted output of the three CEGs in the test machine to being the output of the enabled CEG.

The internal scan shift register 49 is interconnected with an ISSR data bus 80 and an ISSR data bus interface 82 for loading and unloading data bits strings into the ISSR 49. Similarly, the ESSR 58 is interconnected with an ESSR data bus 84 and an ESSR data bus interface 86. Both the ESSR and ISSR data bus interfaces 86 and 82 are controlled by a data bus controller 88 interconnected with the controller 26. The disable/enable bus 62, including A, B, and C scan enable/disable lines 64, 66, and 68, is utilized to enable or disable all of the ISSR latch replicas 54 in a particular copy of the ISSR 49 or from participating in the voting process.

The first test procedure that will be described is the ISSR test. The ISSR 49 functions to set the pre-test input and output states of the test machines 16 and to access post-test output states for comparison with the expected output states for a good test machine. Each voter latch, for example 12A, includes three latch replicas 54, alpha, beta, and gamma. When the DUT 22 is in the test mode the outputs of the alpha, beta, and gamma latch replicas 54 in a given voter latch 12A are directed to voter circuit 50B in the subsequent voter latch 12B in the ISSR 49 by the MUX 40B in the subsequent voter latch 12B. Thus, the output from the voter circuit 50B will have the correct state even if one of the output latches 54A in voter latch 12A is bad. The procedure for testing the latches in the ISSR is well-known, and includes the steps of generating an ISSR test bit string in the data center 28, loading the ISSR test bit string into the ISSR 49 and comparing the posttest output bit string from the ISSR with an ISSR expected value bit string to determine if any test machine storage elements have faults. These bit strings are generated by the data center 28 and transferred to the controller.

If it is determined that an internal voter latch is bad, for example voter latch 12A, then the alpha latch replicas in the A Copy of the ISSR 49 would be enabled and the beta and gamma latch replicas in the B and C copies would be disabled. The ISSR test machine procedure would then be repeated. If the ISSR then tested good, i.e., it was determined that there were no bad alpha latch replicas 54 in the ISSR 49, then it is determined that a bad alpha latch replica 54 is not present in voter latch 12A. In this example, the beta and gamma latch replicas 54' and 54" in test machine storage element 12A would then be bad, since at least two latch replicas must be bad for a voter latch output signal to have the incorrect state. However, if it were determined that the alpha latch replica 56 were bad, then the beta latch replicas in the B Copy of the ISSR 49 must be tested. If the beta latch replica 54' in voter latch 12A were good, then it would be determined that the gamma latch replica 54" is bad. If the beta latch replica is also bad, then the gamma latch replica 54" latch is tested. If all three latch replicas are bad, the DUT is discarded. If a good output latch is present, then the locations of the bad output latches are stored in the controller for utilization in a subsequent repair step.

Thus, the testing of the ISSR 49 is a two-step process. The first level of ISSR testing determines which voter latches 12 in the ISSR 49 are bad. The second level of testing then identifies the bad latch replicas 54 in a bad voter latch 12 by sequentially enabling each latch replica 54 in the bad voter latch 12 to participate in the voting process and testing each enabled latch replica 54. The unique structured design of the ISSR 49 coupled with the repair capability assures that the ISSR 49 will function unless every latch replica 54 in a voter latch 12 is bad. The probability of such an event is low since the defects produced in the fabrication process are generally random events, thus the probability of correlation required to produce three faulty output latches in the same test machine storage element is low.

Once the tester has determined that the ISSR 49 is functioning correctly, it will proceed to test the logic of the microelectronic circuit. In practice, each test machine 16 will be tested to ascertain whether it is bad. As described above, each test machine includes three CEGs where the CEGs include only combinational logic circuitry. Thus the microcircuit is structurally configured so that all the latches in the ISSR 49 and ESSR 58 can be set to any specified value and the test process is reduced to fault simulation testing of the combinational networks in the test machines.

The procedure for testing a single test machine 16 for a fault and for identifying which CEGs in the test machine are bad will now be described with reference to FIG. 4. In FIG. 4, a test machine 16, including three identical CEGs, 10, 10', and 10", has, by way of example, four inputs connected to internal input voter latches 12(i) and input pins 21. The input pins are interconnected with respective external input latches 20 so that the input states of the test machine 16 may be set by setting the internal and external input 12 and 20. As described above, the pre-test states in the internal voter latches 12 and external input latches 20 are set by utilizing the ISSR and ESSR, 49 and 58 respectively. The test machine outputs are directed to an internal output voter latch 12(o) for receiving the output signals from the CEGs 10, 10', and 10". The voted output signals from the voting circuit 50 are received by latch replicas 54 in the voter latch 12.

In operation, a test vector will be applied to the inputs of the test machine 16. For a test machine with four inputs, such as the machine illustrated by way of example in FIG. 4, the test vector will consist of four states, $V_1$ through $V_4$, loaded into the internal and external input latches 12 and 20 through the ISSR and ESSR 49 and 58. The ATG 28 will generate the test vectors and a set of pre-test output states corresponding to the test vectors. The pre-test output state will then be loaded into the internal output voter latches 12(o) through the ISSR 49. The combinational networks in the test machine 16 are tested, utilizing fault simulation. In this process, a set of test vectors are sequentially applied to the inputs of a test machine while the corresponding pre-test output states are loaded into the outputs. After the input and output states of the machine are set, the machine is clocked through a machine cycle and the post-test output state generated in response to the test vector is unloaded and stored for later comparison with the expected output state for a good test machine. The number of test vectors that must be applied to the test machine is determined by the number of logic gates in the combinational networks of the CEGs. The generation of these test vectors, corresponding pre-test output states, and expected states for a good machine is a complicated mathematical process. Methods for generating these tests, however, are not a part of this invention. These methods are described in the above-referenced article by Williams, et al., an article by D. P. Roth entitled "Diagnosis of Automatic Failures: A Calculus and Method", IBM J. of Res. and Dev., V. 10, No. 4, July 1970, pp. 278-291 and the references cited therein.

As described above, if one CEG 10 has a fault, the test machine still tests as a good machine, since the voting circuit 50 will allow the two good CEGs 10 to outvote the CEG 10 with a fault. However, if two or more CEGs 10 in the test machine 16 have faults, then the test machine 16 will test as a bad test machine.

In the case where the test machine is determined to have a fault, the following procedure is followed. First, the beta and gamma CEGs 10' and 10" are disabled utilizing disable inputs 60' and 60" and the fault simulation test repeated with only the alpha CEG 10 enabled. If the alpha CEG 10 tests as a good CEG, then the beta and gamma machines 10' and 10" are bad. This follows from the principle that two CEGs must be bad if the voted output of the test machine tests bad. If the alpha CEG 10 is determined to be bad, then the alpha and gamma CEGs 10 and 10" are disabled and the beta CEG 10' is tested. If the beta CEG 10' is a good CEG, then it follows that the alpha and gamma CEGs 10 and 10" are bad. If the beta CEG 10' is bad, then the alpha and beta CEGs 10 and 10' are disabled and the gamma CEG 10" is tested. If the gamma CEG 10" is also bad, then the device must be discarded because it is not repairable. However, if only two of the three CEGs are bad, the identity of those CEGs is recorded in the data center. Subsequent to retesting, fusible links for disconnecting the two bad CEGs are blown so that the only CEG active in a test machine is a good CEG. Therefore, the test machine will be a good test machine, since the only signal applied to the voting circuit comes from a good CEG and, thus, the voted output of the test machine will be the output of a good CEG.

The procedure for testing and repairing the first of the set machines depicted in FIG. 3 will now be described with reference to FIGS. 2 and 3. In FIG. 3, a first set of test machines, of which 12A, 12B, and 12C are representative, have their inputs interconnected with the internal input voter latches 12 of the ISSR 49 and the external voter latches 20 of the ESSR 58, and have their outputs connected to the internal output voter latches 12 of the ISSR 49. As described above, the DUT 22 has a highly structured design to facilitate testing and in actual practice the test machines will be partitioned into sets for testing, with each set including an associated ESSR and ISSR 58 and 49. In the analysis that follows, the procedure for testing only one set of test machines will be described. However, the same principles may be utilized to test an arbitrary number of sets of test machines in a given device. From FIG. 3 and the above discussion it is apparent that the test machines are blocks of combinational logic being fed by a series of internal input voter latches (the ISSR) and/or input pins fed by external input latches (the ESSR) and terminating at internal output voter latches (the internal voter latches in the ISSR).

Test generation for a particular device is performed in the data center of the ATG 28 of FIG. 2. The data center may contain tests for only a particular device or contain tests for several varying devices with different microelectronic circuits formed thereon. The type of device being tested must be made known to the data center. The test program for a particular device includes a set of test vectors, a pre-test output state bit string (PROSBS), and an expected value bit string (EVBS). At this point in the testing process, the test program does not take into account the redundancy in each test machine 16. The test program includes independent sets of test vectors, for each test machine, that must be sequentially applied to test the logical network in each test machine for faults. The number of test vectors in a test set will be determined by the complexity of the logical networks in the test machine. For a given set of test machines, certain test machines will be completely isolated from each other so that testing of these particular isolated test machines may be conducted simultaneously and the test vectors for each machine may be loaded in parallel. Thus, for each step in testing, the test vectors for these isolated test machines are merged into a bit string and applied to the inputs of the test machines via the ISSR and ESSR. The test program for a particular device is loaded into the controller from the data center 28 via the channel 30.

Referring again to FIG. 3, the local controller 26 loads the first input bit string including the merged test vectors for performing a first test into the input latches of the ESSR and ISSR 58 and 49. The PROSBS is loaded into the ISSR 49 through the ISSR DBI 82 to set the test machine output states in the corresponding internal output voter latch 12 at a given value, for example, 0. The controller then clocks the test machines in the first set through one machine cycle and stores the output signals of the test machines generated in response to the input vectors in the associated internal output voter latch for each test machine. The post-test output states stored in the internal output voter latches of the ISSR form a post-test output state bit string (POSBS). The POSBS is unloaded from the ISSR via the ISSR DB 80 and the ISSR DBI 82, into the local controller 26. The local controller compares the POSBS to the EVBS to determined whether these two bit strings match. If the bits do not match, they are passed back to the Data Center 28 for a determination of which test machines are bad.

At this point, the bad CEGs 10 in the bad test machine 16 are identified by the procedure described above with reference to FIG. 4. To briefly summarize, the alpha, beta, and gamma CEGs of the test machines are sequentially enabled and the test repeated for each CEG in the bad test machine. The locations of the bad CEGs are identified and stored in the controller 26. The test of the first set of test machines then continues, however, compensation for bad test machines already identified is made so that subsequent incorrect bits generated in the POSBS by those previously-identified bad machines will be ignored in the matching step with the EVBS. Therefore, the test procedure does not include repeated test machine analysis of a bad test machine.

When the test program has finished running, the device under test 22 is removed from the tester and transferred to a repair station. The locations of the fuses for the bad CEGs are transferred to the repair station from the fuse file in the controller 24. The fuses are then blown, for example, by a laser, and the repaired device is returned to the tester. The test is then repeated because certain faults may have been masked by the bad CEGs and will become apparent in subsequent testing. If the device tests good, then it is passed into inventory and the testing procedure is complete.

In summary, the testing procedure includes the following steps:

1. Test the ISSR and repair if possible. If repair is impossible, discard the device.
2. Test a set of test machines to determine if any bad test machines are included in the set.
3. If a bad test machine is located, proceed to perform test machine analysis to identify the bad CEGs in the bad test machines.
4. Store the locations of the bad CEGs in a fuse file located in the controller.
5. Upon completion of testing, transfer the device under test to the repair center and blow the fuses of the bad CEGs identified in the fuse file.
6. Return the device to the tester to repeat the test with the bad CEGs disconnected from the device.
7. Repeat steps 2 through 5 until it is determined that the device is either a good or a bad device.

A more detailed description of the internal scan shift register (ISSR) described in FIG. 3 will now be presented with reference to FIG. 5. In FIG. 5, three CEGS 10A, 10B, and 10C included in a first set of CEGS of the A Copy of the microelectronic circuit are depicted. Since the output circuit associated with each CEG is the same, the following description will refer to the output carrier 12B interconnected with the output of CEG 10B. This output circuit 12B is the circuitry of a voter latch associated with the A copies of the microelectronic circuit and the ISSR 49.

Referring now to FIG. 5, the circuit element group output circuit 12B includes a two input multiplexer 40B, a voter element 50B, and a latch replica 54B. The output signal of CEG 10B is routed to data input (2) line 44B of multiplexer 40B. The output signal from latch replica 54C in the output circuit 12C of CEG 10C is routed to data input (1) line 42B of multiplexer 40B. This interconnection of the output of a latch replica in voter latch copy 12C to the data (1) input 42B of a multiplexer 40B in a succeeding voter latch copy 12B is continued through the ISSR 49. A mode select signal is conducted on signal line 46 to the select (SEL) input of multiplexer 40B and all other multiplexers in the output circuits of the first set of CEGs. Depending upon the state of the mode select signals, selection is made between multiplexer inputs lines 1 and 2, 42B or 44B, to communicate the selected input to the multiplexer output line D and the complement of the input to line $\overline{D}$ 48C. The voter 50B receives the multiplexer outputs D and $\overline{D}$. This voter 50B is the part of the voting circuit 50 of FIG. 3 that is included in the A Copy of the microelectronic circuit. The voting circuit 50 also includes identical voter replicas 50' and 50" in the B and C copies of the microelectronic circuit. These voter replicas 50, 50', and 50" are interconnected by a voting bus 142 to form the voting circuit 50 of FIG. 3.

In FIG. 5 there is also depicted a multiplexer enable/disable line (MUS E/D) 60 interconnected with inhibit (INH) inputs of the multiplexers 40. A high signal on the MUX E/D line functions to disable the multiplexer 40 and all other multiplexers associated with the A copy first set of CEGs from participating in the voting operation of the interconnected voting circuit.

The output signal from the voter 50B is applied to the data (D) input of the latch replica 54B. A clock (CLOCK-1) signal is conducted by Clock line 146 to the clock (CLK) input of the latch replica 54 and all other output latches associated with the first set of CEGs. The latch replica 54 includes a parallel output line 56 that carries the output signal from that latch replica 54 to the inputs of other circuit element groups in the A Copy of the microelectronic circuit or an output port 21. Note also that the output line from the latch replica 54B is connected to the data input (1) line 42A of the multiplexer 40A of the output circuit 12A associated with first circuit element group 10A.

The internal scan shift register 49 includes the multiplexers 40A, 40B, and 40C, the mode select line 46, the latch replicas 54A, 54B and 54C, and the signal lines 42B and 42C connecting the Q output of a latch replica 54A to the data input (1) line 42B of the multiplexer 40B in the output circuit of the next CEG 10B in the first set. The multiplexers 40A, 40B and 40C, along with MUX E/D line 60, also function in the enable/disable circuitry associated with the first set of CEGs.

FIG. 5 also represents the configuration of the first set of CEGs, with associated output circuitry, in copies B and C. The interconnection of elements in the A, B, and C copies is illustrated in FIG. 6. In FIG. 6, the outputs of the MUXs 40, 40' and 40" are routed by the voter bus to be inputs of the voter circuits 50, 50' and 50". The states on the voter output lines 52, 52', 52" are all equal and have the same value as the value of the majority of the output states from MUXs 40, 40', and 40". Referring back to FIG. 5, although the circuit elements in B and C are not depicted in FIG. 5 they will be referred to in the following discussion with the replica of the circuit element in the B copy having reference numeral being the corresponding reference numeral of FIG. 5 primed replica in the C circuit having a reference numeral being the corresponding reference numeral of FIG. 5 double primed.

In normal operation, the state of the SEL signal on the mode select line 46 is set so that the output signal from CEG 10B received on data input (2) line 44B is transmitted to the multiplexer outputs D and $\overline{D}$. The output signals will then be routed through the voter 50B. The voted output signal from voter 50B is received at the input of the latch replica 54B. This voted output signal will then be transmitted to succeeding CEGs or output ports in Copy A by application of the CLOCK-1 signal to the latch replica.

During testing, the test vector states will be loaded into internal and external input latches 20 and 12 of the ESSR 58 and ISSR 49 connected to the inputs of the CEGs in the first set, of which 10A, 10B and 10C are exemplary.

The pre-test output state bit string (PROSBS) is loaded into the latch replicas 54A, 54B and 54C by the following procedure. First, the state of the SEL signal is set so that the data input (1) line 42 of each multiplexer is enabled. The first bit of the PROSBS is applied to the data input (1) line 42C of multiplexer 40C, and multiplexer replicas 40C' and 40C" in B and C copies, via, for example, a first I/O pin 20(i). The signal corresponding to this first bit is transmitted to voter 50C, which generates a voted output signal having the state of the majority of the input signals from multiplexers 40C, 40C', and 40C", i.e., the state of the first bit of the PROSBS.

This voted output signal is applied to input D of latch replica 54C. A CLOCK-1 signal then transfers the first bit of the PROSBS from the input D to the output Q of the latch replica 54C. This first bit is transferred to the data input (1) line 42B of multiplexer 40B and is transmitted through outputs D and $\overline{D}$ to voter 50B and to the input D of latch 54B. Next, the second bit of the PROSBS is applied to the data input (1) line of the multiplexer 40A. The entire PROSBS is loaded and shifted through the ISSR 49 by the abovedescribed procedure. In actual practice, all of these states may be 0 or low.

After loading the PROSBS into the ISSR, the state on the mode select signal line 46 is set so that data input 2 of the multiplexer is enabled. A CLOCK-2 signal then applies the test vector states in the input latches of the ESSR and ISSR 58 and 49 to the inputs of the circuit element groups. The output signals of the CEGs, generated in response to the input vectors, are accepted on the data input (2) lines 44 of the multiplexers and routed via the voters to the D inputs of the latch replicas 54. These post-test output states are then transferred to the Q output ports of the latch replicas 54 from the D input ports by a second CLOCK-1 signal. Thus, the internal output voter latches of the internal scan register ISSR are now set at the post-test output states of the CEGs. The set of post-test output states generated by the CEGs in the first set is designated the post-test output state bit string (POSBS). The state of the SEL signal on the mode select line 140 is again set to enable the data input (1) line 42 of the multiplexers 40 so that the POSBS may be shifted out of the ISSR through an output pin 21(o), utilizing the procedure described above for shifting the PROSBS. The POSBS is then compared to the expected value bit string (EVBS) in the manner described above.

If the comparison between the POSBS and the EVBS indicates that there is a bad test machine in the first set, then the following procedure will be followed to identify bad CEGs in the bad test machine. The CEGs in a bad test machine are sequentially enabled by setting the state of the signal on the MUX E/D line 60 in the A microcircuit so that all multiplexers in the A Copy participate in the voting process. The state of the signals on the MUX E/D lines in the B and C copies 60' and 60" are set so that all multiplexers in the B and C copies are disabled from participating in the voting process. Thus, the CEGs in the A copy are enabled and the CEGs in the B and C copies are disabled. The steps for testing the test machines described above are now repeated. The CEGs in the B and C copies are then sequentially enabled and tested to determine whether they are bad. The locations of all bad CEGs are stored in a fuse file in the data center.

The controller and ATG data center 26 and 28 may be realized by digital computers including a digital computer controller and a digital computer memory. The test program may be stored in the digital computer memory and carried out according to instructions for controlling the digital computer controller. The generation of the test program and the application of the test program to the DUT is not a part of the present invention. The principles of test generation and test procedure are described in the references set forth above.

The functions of the data center and the local controller have been assigned in the description above by way of example, not limitation. In actual practice, the function of the data center and local controller could be performed by one computer.

The foregoing is a detailed description of a preferred embodiment of the present invention. It is understood by persons of ordinary skill in the art that alternative processes and circuits may be substituted for many of the processes and circuits described above to perform substantially the same function in substantially the same manner. For example, the input and output states of the test machines may be set directly through auxiliary I/O ports designed into the device, instead of being loaded into the ISSR and ESSR. Additionally, any test program for identifying bad test machines may be utilized. Furthermore, alternative circuitry for enabling and disabling the CEGs and test machine storage elements may be utilized. Active circuits, for example latches and gating networks, for repairing the device by removing bad CEGs from the microcircuit may be substituted for the static, fusible links. The invention is not limited to any particular digital circuit technology but may be configured in ECL, MOS, CMOS, TTL, or any other suitable technologies.

What is claimed is:

1. A system for testing a device under test (DUT), having DUT I/O ports, with the DUT of the type including N identical logical circuit copies, each circuit copy including storage elements (SEs) and combinatorial elements (CEs) and with each logic circuit copy structured into circuit element groups (CEGs) including only CEs, with each CEG having a set of inputs coupled to input SEs and a single output, where each of the identical logical circuit copies are structured into identical, corresponding CEGs, said test system comprising:

a first test machine including N identical, corresponding first CEGs from each of the N circuit copies;

a first set of input SEs coupled to the input ports of said first CEGs of said first test machine;

a first voting logic circuit, having N input ports and N output ports, for generating a logic output signal at said N output ports, with the logic state of the output signal equal to the logic state of the majority of input signals received at said first voting logic circuit input ports;

first enabling means for controllably coupling the output port of each said first CEG in said first test machine to a respective one of the input ports of said first voting logic circuit;

a first set of N outputs SEs, with each output SE having an input port coupled to a respective one of the output ports of said voting logic circuit;

means for transferring the logic state stored in an SE in said first set of output SEs to the DUT I/O ports;

means for generating a test vector for setting the input states of said first set of input SEs to test said first test machine for faults and for transferring said test vector to the DUT I/O ports;

means for generating a pre-test output state, corresponding to said test vector, to set the output state of said first set of output SEs prior to fault testing and for transferring said pre-test output state to the DUT I/O ports;

means for generating an expected value post test output state;

means, coupled to the DUT I/O ports, for loading said test vector into the first set of input SEs;

means, coupled to the DUT I/O ports, for setting the output state of the first set of output SEs to said pre-test output state;

means, coupled to said first test machine, for clocking said first test machine through one machine cycle to generate a post-test output state; and means, coupled to said DUT I/O ports, for comparing said post-test output state with said expected value post test output state to determine whether said first test machine has a fault.

2. The invention of claim 1 wherein said enabling means includes:

a first set of N MUXs having at least a first and second data input port, a data output port, a select port, an an inhibit port, with the output port of each CEG of the first test machine coupled to the first input port of a respective one of said N MUXs and with the output port of each MUX coupled to a respective input port of said voting circuit so that if a test machine has a fault the first CEGs may be sequentially coupled to said voting circuit by directing appropriate signals to the inhibit port to determine which first CEG has a fault.

3. The invention of claim 1 wherein said means for setting comprises:

an internal shift register, including the SEs of said logical circuit copies, coupling the DUT I/O ports to the input ports of said first set of N output SEs.

4. The invention of claim 1 or 3 further comprising:

a second test machine, including N identical second CEGs;

a second set of input Ses coupled to the input ports of the second CEGs of said second test machine;

a second voting logic circuit, having N input ports and N output ports;

second enabling means for controllably coupling the output port of each second CEG to a respective one of the input ports of said second voting logic circuit; and a second set of N output SEs having input ports coupled to respective output ports of said second voting logic circuit.

5. The invention of claim 4 wherein said internal shift register comprises:

means coupling the output port of one of the SEs in said second set of output SEs to the second input port of one of said MUXs so that said first and second sets of output SEs may be configured as shift register elements by selecting the second input ports of said MUXs.

* * * * *